(12) United States Patent
Suh et al.

(10) Patent No.: US 8,563,197 B2
(45) Date of Patent: Oct. 22, 2013

(54) METHODS, APPARATUS AND COMPUTER PROGRAM PRODUCTS FOR FABRICATING MASKS AND SEMICONDUCTOR DEVICES USING MODEL-BASED OPTICAL PROXIMITY EFFECT CORRECTION AND LITHOGRAPHY-FRIENDLY LAYOUT

(75) Inventors: Sung-soo Suh, Gyeonggi-do (KR); Suk-joo Lee, Gyeonggi-do (KR); Yong-hee Park, Seoul (KR); Mi-kyeong Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1299 days.

(21) Appl. No.: 12/238,884

(22) Filed: Sep. 26, 2008

(65) Prior Publication Data

US 2009/0087758 A1 Apr. 2, 2009

(30) Foreign Application Priority Data

Sep. 27, 2007 (KR) ........................ 10-2007-0097379

(51) Int. Cl.
 G06F 17/50 (2006.01)
(52) U.S. Cl.
 USPC ...................... 430/5; 716/52; 716/55; 716/53
(58) Field of Classification Search
 USPC .................................... 430/5; 716/52, 55, 53
 See application file for complete search history.

(56) References Cited

U.S. PATENT DOCUMENTS

| 2004/0259005 | A1* | 12/2004 | Nakano et al. ..................... 430/5 |
| 2007/0157152 | A1* | 7/2007 | Strelkova et al. ............... 716/21 |
| 2007/0231711 | A1* | 10/2007 | Aton et al. ......................... 430/5 |
| 2008/0304029 | A1* | 12/2008 | Pforr et al. ...................... 355/44 |
| 2009/0125870 | A1* | 5/2009 | Aton et al. ...................... 716/21 |

FOREIGN PATENT DOCUMENTS

| JP | 2002-333700 | 11/2002 |
| JP | 2006-058413 | 3/2006 |
| KR | 1020050077167 A | 8/2005 |
| KR | 100688893 B1 | 2/2007 |

OTHER PUBLICATIONS

Korean Office Action, corresponding Korean App. No. 10-2007-0097379, May 1, 2013, 5 pages.

* cited by examiner

*Primary Examiner* — Daborah Chacko Davis (74) *Attorney, Agent, or Firm* — Myers Bigel Sibley & Sajovec, P.A, (57) ABSTRACT

Design rules for circuit patterns of a semiconductor device are identified, and schematic layouts of the circuit patterns are generated according to the design rules. Lithography friendly layout (LFL) circuit patterns are generated from the schematic layouts. Target layout circuit patterns are generated from the LFL circuit patterns. Optical proximity effect correction (OPC) is performed on the target layout circuit patterns to generate OPC circuit patterns. A mask is fabricated from the OPC circuit patterns, and may be used fabricate a semiconductor device.

13 Claims, 7 Drawing Sheets

METHODS, APPARATUS AND COMPUTER PROGRAM PRODUCTS FOR FABRICATING MASKS AND SEMICONDUCTOR DEVICES USING MODEL-BASED OPTICAL PROXIMITY EFFECT CORRECTION AND LITHOGRAPHY-FRIENDLY LAYOUT

CROSS-REFERENCE TO RELATED PATENT APPLICATION

This application claims the benefit of Korean Patent Application No. 10-2007-0097379, filed on Sep. 27, 2007, in the Korean Intellectual Property Office, the disclosure of which is incorporated herein in its entirety by reference.

FIELD OF THE INVENTION

The present invention relates to fabrication of masks and semiconductor devices, and more particularly, to fabrication of masks and semiconductor devices using optical proximity effect correction (OPC).

BACKGROUND OF THE INVENTION

Semiconductor devices are progressively becoming more highly integrated and critical dimensions of patterns have become correspondingly smaller. Generally, it has become increasingly difficult to accurately realize patterns having desirably small critical dimensions using conventional photolithography processes. To transfer a circuit pattern of a mask to a wafer may require resolution sufficient to provide critical dimensions less than an optical wavelength used in a conventional exposure system.

Typically, a pattern for a semiconductor device is formed using a photolithography process. A layout of a pattern of a semiconductor device to be formed on a wafer is designed. A mask may then be fabricated based on the laid-out pattern of the semiconductor device. The mask typically has a structure including a light blocking layer arranged on a transparent substrate. The transparent substrate may include, for example, quartz, and the light blocking layer may include, for example, chrome. A pattern is formed on a semiconductor wafer by performing the photolithography process using the mask.

When a circuit pattern ("transfer circuit pattern") is formed on a wafer using a photolithography process, there are typically differences between the transfer circuit pattern formed on the wafer and the designed circuit pattern. Such differences may be caused by an optical proximity effect and/or by an etching loading effect. A deviation in the transfer circuit pattern on the wafer may be particularly serious in a pattern having a critical dimension less than the optical wavelength used in the exposure system.

More accurate transfer of a circuit pattern from mask to wafer may be achieved by using a PPC (process proximity correction) technology wherein correction is made by considering a deviation in the transfer circuit pattern formed on the wafer when creating the mask. A conventional PPC technology predicts and analyzes the optical proximity effect and the loading effect and then corrects the layout of the circuit pattern of the mask based on the results of analysis. PPC technology typically uses an OPC (optical proximity effect correction) method.

OPC techniques may be classified as model-based OPC techniques and rule-based OPC techniques. A typical model-based OPC technique corrects the circuit pattern of the mask by applying a single model to a full chip on the wafer. The accuracy of the correction achieved may be high, but a large amount of computation may be needed. A typical rule-based OPC technique corrects the circuit pattern of the mask by applying a single rule to a full chip on the wafer. The amount of computation required may be small, but accuracy of correction may be low.

In some conventional rule-based OPC techniques, a design rule of a circuit pattern is decided and then a full chip is laid out according to the design rule. Subsequently, a correction amount corresponding to a line width and a space width of each circuit pattern is calculated, and each circuit pattern may be corrected based on the calculated correction amount. A mask is fabricated based on the circuit pattern corrected by the OPC (hereinafter, referred to as "OPC circuit pattern), and a desired circuit pattern is transferred to a wafer using the fabricated mask.

In some conventional rule-based OPC processes, the rule-based OPC is performed after the full chip layout is completed. In such a conventional rule-based OPC, the layout of the circuit pattern is fixed at a step of laying out a full chip. Thus, when a defect occurs in the step of laying out a full chip, the OPC may be performed without the defect being repaired. Consequently, the OPC circuit pattern may still have the defect, which may make it unusable for obtaining a target circuit pattern. Moreover, because the OPC is performed, after the layout of the circuit pattern of the mask is fixed, it may not be possible to change or amend the layout. Furthermore, a conventional, rule-based OPC process may be limited in detecting, through experiments and the like, a portion where a process window for a semiconductor device, such as a memory device, is weak.

SUMMARY OF THE INVENTION

The present invention provides methods of fabricating masks and semiconductor devices using model-based OPC (optical proximity effect correction), whereby an optical model is generated before a layout of a circuit pattern of a mask is fixed, and the layout of the circuit pattern of the mask is corrected and fixed based on the generated optical model.

Some embodiments of the present invention provide methods for fabricating a mask which may be used in fabrication of a semiconductor device. Design rules for circuit patterns of a semiconductor device are identified, and schematic layouts of the circuit patterns are generated according to the design rules. Lithography friendly layout (LFL) circuit patterns are generated from the schematic layouts. Target layout circuit patterns are generated from the LFL circuit patterns. Optical proximity effect correction (OPC) is performed on the target layout circuit patterns to generate OPC circuit patterns. A mask is fabricated from the OPC circuit patterns, and may be used fabricate a semiconductor device. The present invention may also be embodied as computer apparatus or computer program products.

BRIEF DESCRIPTION OF THE DRAWINGS

The above and other features and advantages of the present invention will become more apparent by describing in detail exemplary embodiments thereof with reference to the attached drawings in which.

FIG, 2C illustrates circuit patterns transformed as LFL (lithography friendly layouts) with respect to the circuit patterns of FIG. 2A.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise.

Embodiments of the present invention are described below with reference to schematic diagrams illustrating methods, apparatus (systems and/or devices) and/or computer program products. It is understood that a block of the diagrams, and combinations of blocks in the diagrams, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the diagrams. These computer program instructions may also be stored in a computer-readable memory that can direct a computer or other programmable data processing apparatus to function in a particular manner, such that the instructions stored in the computer-readable memory produce an article of manufacture including instructions which implement the function/act as specified in the diagrams. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the diagrams. Accordingly, the diagrams support methods, apparatus and computer program products (i.e., computer-readable media embodied with computer program code).

The present invention may be embodied in hardware and/or in software (including firmware, resident software, microcode, etc.). Furthermore, the present invention may take the form of a computer program product on a computer-usable or computer-readable storage medium having program code (instructions) embodied in the computer-readable storage medium for use by or in connection with an instruction execution system. In the context of this document, a computer-usable or computer-readable storage medium may be any medium that can contain, store, communicate or transport the program for use by or in connection with the instruction execution system, apparatus, or device.

The computer-usable or computer-readable storage medium may be, for example, an electronic, magnetic, optical, electromagnetic or semiconductor system, apparatus or device. More specific examples (a non-exhaustive list) of the computer-readable storage medium would include the following: a portable computer diskette, a random access memory (RAM), a read-only memory (ROM), an erasable programmable read-only memory (EPROM or Flash memory), and a portable optical and/or magnetic media, such as a flash disk or CD-ROM.

Figure 1:
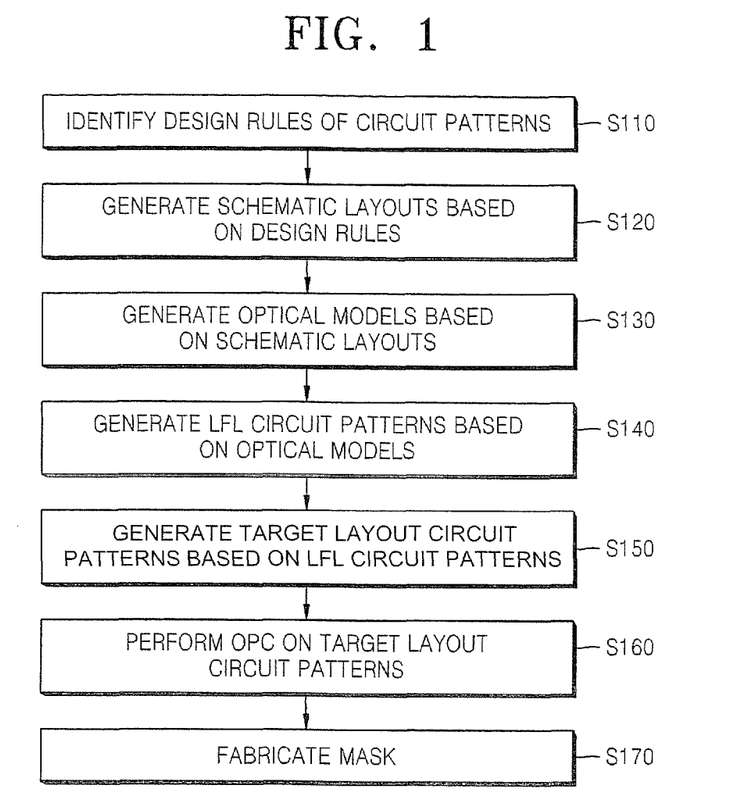
FIG. 1 is a flow chart illustrating a method of fabricating a mask using model-based OPC (optical proximity effect correction) according to some embodiments of the present invention.

FIG. 1 is a flow chart illustrating operations for fabricating a mask according to some embodiments of the present invention. Referring to FIG. 1, in step S110, design rules of circuit patterns to be arranged on a mask are identified. The circuit pattern may be for a light blocking layer pattern, for example, a chrome pattern, which is arranged on a mask substrate, for example, a quartz substrate. The circuit pattern is a pattern to be transferred to a wafer during a photolithography process which will be subsequently performed using the mask.

In step S120, a schematic layout of the circuit pattern is generated based on the identified design rules. The schematic layout is to conceptually design the circuit pattern, to improve an electrical characteristic of a device. For example, when a device is a memory device, such as DRAM, in the schematic layout step S120 the layout of circuit patterns of a memory cell block and a core block can be designed. In the schematic layout step S120, the layout of a circuit pattern of a peripheral block as well as the memory cell block and core block can be designed.

Subsequently, in step S130, optical models of the circuit patterns are generated, based on the schematic layout of the circuit pattern. The optical models may be optical intensity profiles of each circuit pattern, each having different Gaussian distributions. The optical models may be generated considering not only the distance between adjacent circuit patterns, but also the peripheral environment of the circuit patterns. A transfer circuit pattern of the wafer may be predicted through simulation, based on the schematic layout, and the optical model may be generated based on the predicted circuit pattern.

In step S140, LFL (lithography friendly layout) circuit patterns of the circuit patterns of the mask are generated based on the optical models. The LFL circuit patterns are formed by transforming the circuit pattern of the mask in a manner desirable for a photolithography process. In step S150, a layout of the circuit patterns to be arranged on the mask is designed based on the LFL circuit patterns. The layout of the LFL circuit patterns based on the optical models (hereinafter, referred to as "optical model-based layout") as a target layout of the circuit patterns to be arranged on the mask is the layout of a full chip of a semiconductor device. Because the LFL circuit patterns are generated using the optical model before the layout of the full chip of the semiconductor device is fixed, a defect of the circuit pattern which may occur in the full chip layout step is repaired and therefore the layout of the full chip in which the defect is repaired is obtained.

In step S160, OPC (optical proximity effect correction) is performed on the laid-out target circuit patterns (hereinafter, referred to as "target layout circuit pattern") to generate OPC patterns. The OPC process may calculate the transfer circuit pattern on the wafer through simulation based on the target layout circuit patterns, and may perform OPC so as to be proximate to a desired circuit pattern of the semiconductor device to be obtained by the calculated transfer circuit patterns. In the step S160, the mask is fabricated based on the OPC circuit patterns.

Figure 2A:
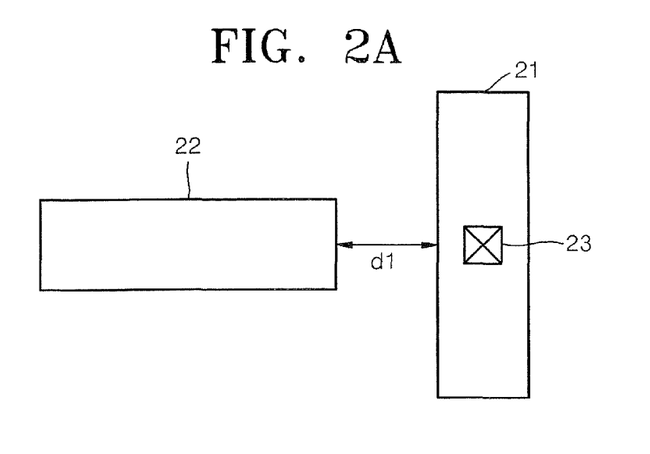
FIG. 2A illustrates circuit patterns arranged on the mask according to some embodiments of the present invention.
Figure 2B:
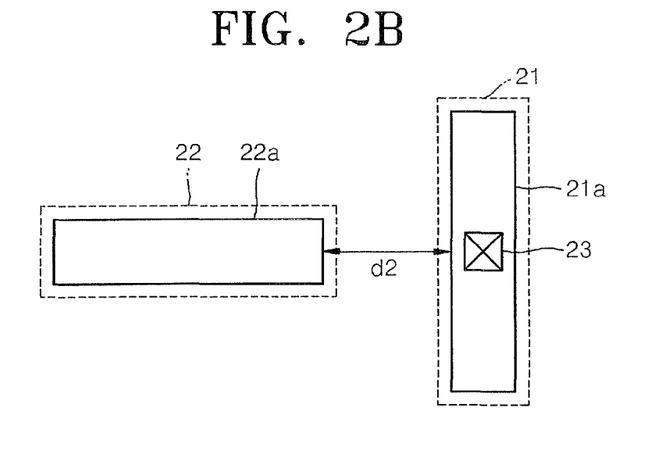
FIG. 2B illustrates OPC circuit patterns when the OPC is directly performed without generating optical models of the circuit patterns of FIG. 2A.
Figure 2C:
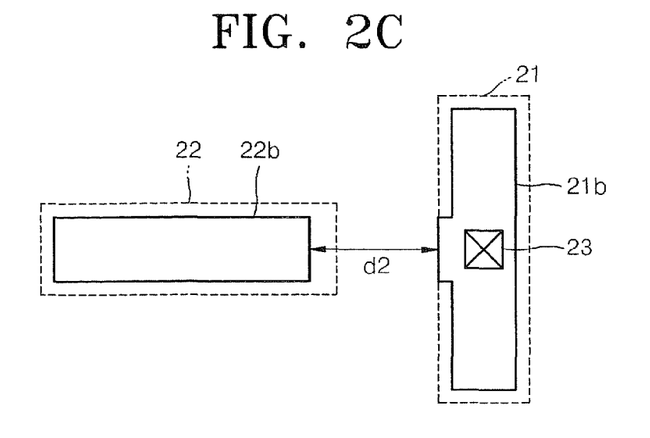

FIGS. 2A through 2C illustrate examples of circuit patterns arranged on a mask. Referring to FIG. 2A, a first circuit pattern 21 and a second circuit pattern 22 are arranged on a mask. The first circuit pattern 21 and the second circuit pattern 22 may be circuit patterns obtained in the schematic layout step S120 of FIG. 1. The first circuit pattern 21 and the second circuit pattern 22 each have a predetermined critical dimension and may be arranged to be spaced apart from each other by a space d1. At least any one of the first circuit pattern 21 and the second circuit pattern 22, for example, the first circuit pattern 21, may include a contact hole 23.

FIG. 2B illustrates circuit patterns 21a and 22a obtained as a result of performing the OPC without performing the step S130 of generating the optical models with respect to the first circuit pattern 21 and the second circuit pattern 22. The first OPC-performed circuit pattern 21a (hereinafter, referred to as "first OPC circuit pattern) and the second OPC-performed circuit pattern 22a (hereinafter, referred to as "second OPC circuit pattern) are corrected by rule-based OPC with respect to the first circuit pattern 21 and the second circuit pattern 22. The first OPC circuit pattern 21a and the second OPC circuit pattern 22a are obtained by inwardly shifting from the contours of the first circuit pattern 21 and the second circuit pattern 22 by a predetermined distance. The space between the first and second OPC circuit patterns 21a and 22a increases to d2, thereby compensating an optical proximity effect.

The first OPC circuit pattern 21a and the second OPC circuit pattern 22a are the patterns uniformly corrected by the OPC according to the decided rules. For example, the first OPC circuit pattern 21a and the second OPC circuit pattern 22a are OPC-corrected by changing the critical dimensions of the first circuit pattern 21 and the second circuit pattern 22, based on the space d1 between the first circuit pattern 21 and the second circuit pattern 22. Thus, the correction is made without considering the peripheral environments of the first and second circuit patterns 21 and 22, such as whether a contact is arranged on the first circuit pattern 21 and/or the second circuit pattern 22, whether a dummy pattern is arrange to be adjacent to the first circuit pattern 21 and/or the second circuit pattern 22, or whether a circuit pattern is arranged at other layers than the first circuit pattern 21 and/or the second circuit pattern 22. Thus, when, for example, the contact hole 23 is formed at a portion of the first circuit pattern 21 proximate the second circuit pattern 22 and the OPC is performed considering only the space d1 between the first circuit pattern 21 and the second circuit pattern 22 as illustrated in FIG. 2B, it may be difficult to secure a sufficient overlay margin.

Referring to FIG. 2C, in some embodiments of the present invention, the optical models are generated by in advance considering not only the space d1 between the first circuit pattern 21 and the second circuit pattern 22, but also the peripheral environments of the first circuit pattern 21 and the second circuit pattern 22 before the OPC is performed, and LFL circuit patterns 21b and 22b are generated based on the optical models. That is, when the contact hole 23 is positioned in the first circuit pattern 21, the first and second OPC circuit patterns 21a and 22a of FIG. 2B are inwardly shifted uniformly by the predetermined distance from the outer lines of the first and second circuit patterns 21 and 22. However, unlike the first and second OPC circuit patterns 21a and 22a, when the contact hole 23 is positioned in the first circuit pattern 21, the portion of the first LFL circuit pattern 21b corresponding to the second LFL circuit pattern 22b is not shifted and only the rest of the first LFL circuit pattern 21b is inwardly shifted from the contours of the first circuit pattern 21, and the portion of the second LFL circuit pattern 22b corresponding to the contact hole 23 of the first LFL circuit pattern 21b is inwardly shifted by a relatively bigger distance compared to the rest of the second LFL circuit pattern 22b, from the contours of the second circuit pattern 22. Then, the distance d2 between the first LFL circuit pattern 21b and the second LFL circuit pattern 22b may be maintained as it is.

Because the first and second LFL circuit patterns 21b and 22b are obtained by considering and predicting not only defects that may occur in the first and second OPC circuit patterns 21a and 22a obtained after the OPC is performed with respect to the first and second circuit patterns 21 and 22 but also peripheral environments of the first and second circuit patterns 21 and 22, a pattern defect, such as a bridge, formed after the OPC is performed, may be prevented.

A method of generating the optical model according to some embodiments of the present invention can be mathematically described as follows. When the optical intensity of a circuit pattern of a mask is indicated as $I_0(x,y)$ and the optical intensity of a circuit pattern of an OPC mask is indicated as $I_{OPC}(x,y)$, $I_0(x,y)$ and $I_{OPC}(x,y)$ can be expressed as $$I_0(x,y)=M_T^T \otimes UU^T \otimes M_T \quad (1)$$

$$I_{OPC}(x,y)=M_{OPC}^T \otimes UU^T \otimes M_{OPC} \quad (2)$$

where $M_T^T$ indicates transformation of a target mask. $M_T$ indicates the target mask, U indicates a kernel, $U^T$ indicates transformation of the kernel, $M_{OPC}^T$ indicates transformation of an OPC mask, $M_{OPC}$ indicates the OPC mask, and $\otimes$ indicates
convolution. The kernel means space domain mapping using the optical model. The target mask means the mask including a target layout circuit pattern, for example, the mask being full-chip laid out based on the first and second LFL circuit patterns 21b and 22b of FIG. 2C, i.e., the mask to be obtained. The OPC mask means the mask including the OPC circuit patterns 21a and 22a of FIG. 2B.

In an ideal case, the convolution of the transformation $M_{OPC}^T$ of the OPC mask and the kernel U are same as the convolution of the transformation $M_T^T$ of the target mask and a new kernel $U_{new}$ to be obtained in the present invention, as:

$$M_{OPC}^T \otimes U = M_T^T \otimes U_{new} \quad (3)$$

When an OPC signal is analogized from the target mask $M_T$, it can be expressed as:

$$I_{OPC}(x,y)=M_{OPC}^T \otimes UU^T \otimes M_{OPC}=M_0^T \otimes U_{new}U_{new}^T \otimes M_0 \quad (4)$$

When an optical model, that is, the new kernel $U_{new}$, is generated from Formula (4), the target mask $M_T$ is obtained:

$$U_{new}=UA \quad (5)$$

where A indicates the transformation matrix between the OPC mask and the target mask.

Figure 3:
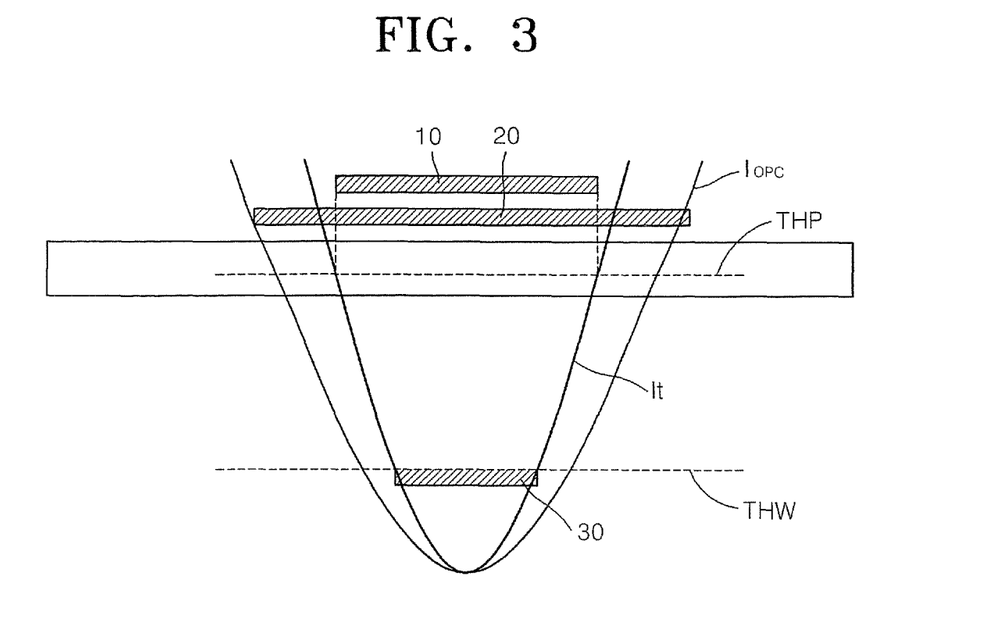
FIG. 3 illustrates optical intensity profiles of a target mask and an OPC mask according to some embodiments of the present invention.

FIG. 3 illustrates optical intensity profiles of a target mask 10 and an OPC mask 20 according to some embodiments of the present invention. In FIG. 3, Iope indicates an optical intensity profile of the OPC mask 20, and It indicates an optical intensity profile of the target mask 10. THP indicates an image threshold value of the optical model, and THW indicates an image threshold value on a wafer 30. Because the OPC has been performed, the optical intensity Iope of the OPC mask 20 is not within the threshold value of the wafer 30, and therefore, it actually it does not appear on the wafer 30. However, the optical intensity It of the target mask actually appears on the wafer 30. When the circuit pattern of the target mask 10 is same as the circuit pattern of the OPC mask 20 and the OPC is performed with respect to the target mask 10, that is, the target layout circuit pattern, the optical intensity It of the target mask obtains the actually same profile as the optical intensity Iope of the OPC mask.

Figure 4:
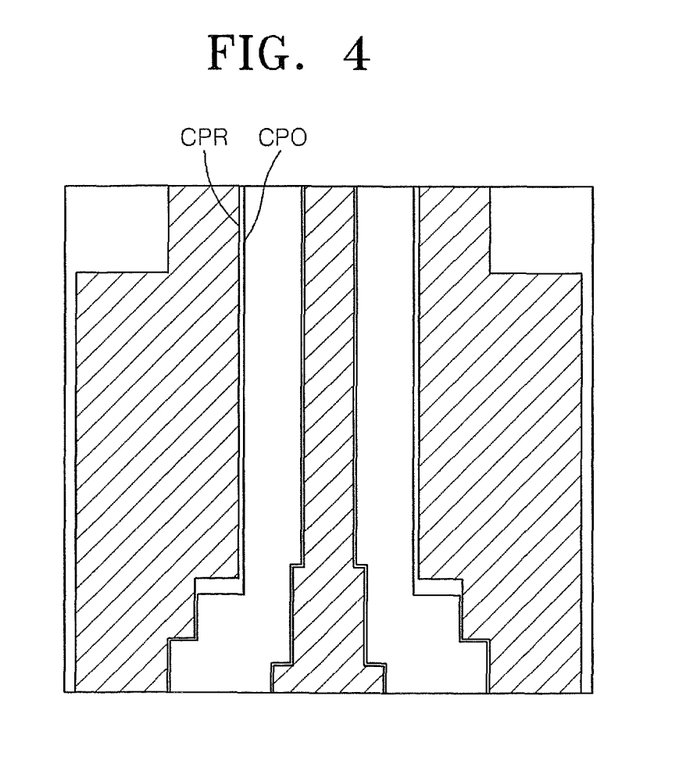
FIG. 4 illustrates LFL circuit patterns and OPC circuit patterns according to some embodiments of the present invention.

FIG. 4 illustrates an LFL circuit pattern CPR obtained using an optical model, and a circuit pattern CPO on a mask according to some embodiments of the present invention. Referring to FIG. 4, the LFL circuit pattern CPR corresponds to the LFL circuit patterns 21b and 22b of FIG. 2C, and the OPC circuit pattern CPO corresponds to the circuit patterns 21 and 22 of FIG. 2A. It is noted that, compared to the pitch between the OPC circuit patterns CPO, the pitch between the LFL circuit patterns CPR is friendly to the photolithography process.

Figure 5A:
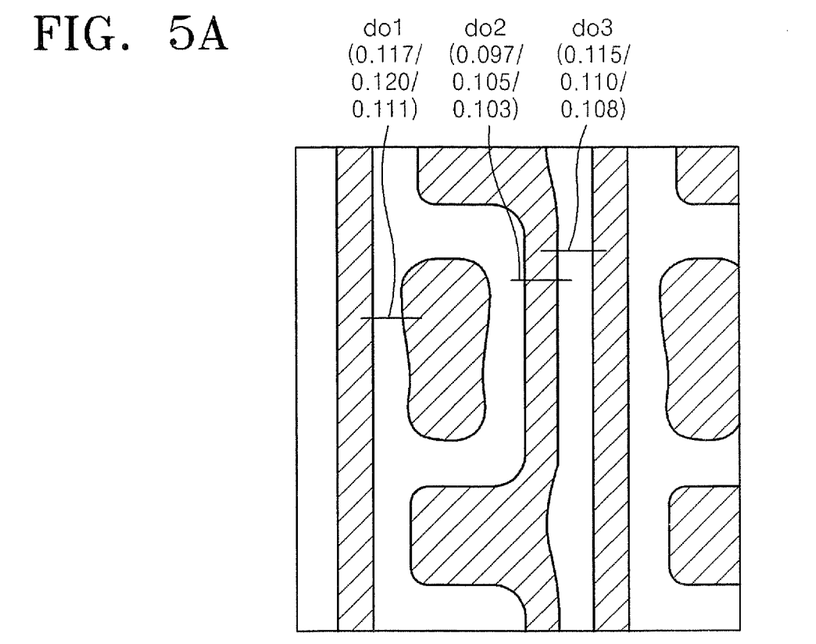
FIG. 5A illustrates circuit patterns of a mask obtained after the OPC is performed without generating optical models in the prior art.
Figure 5B:
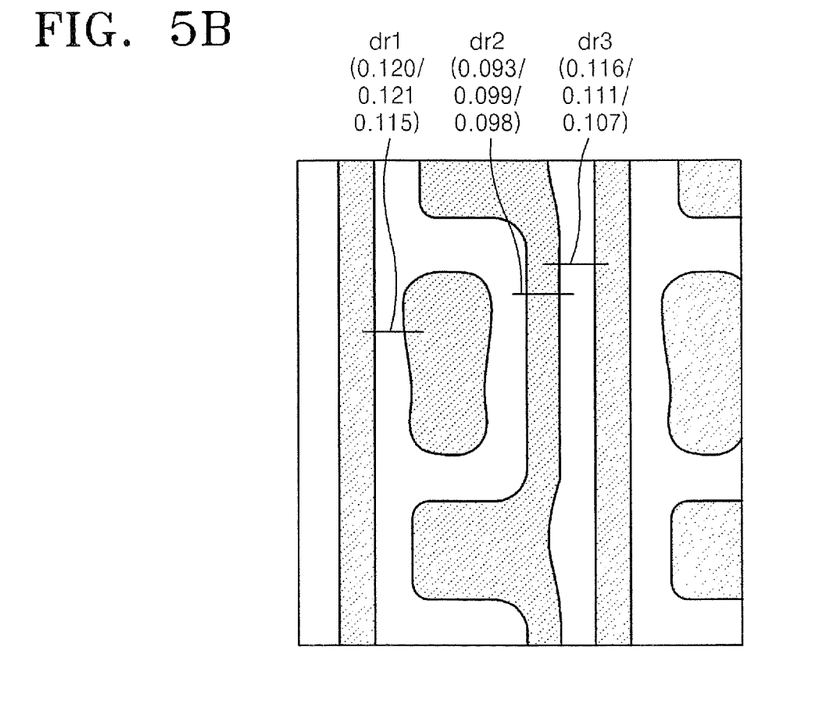
FIG. 5B illustrates target layout circuit patterns obtained after OPC is performed according to some embodiments of the present invention.
Figure 5C:
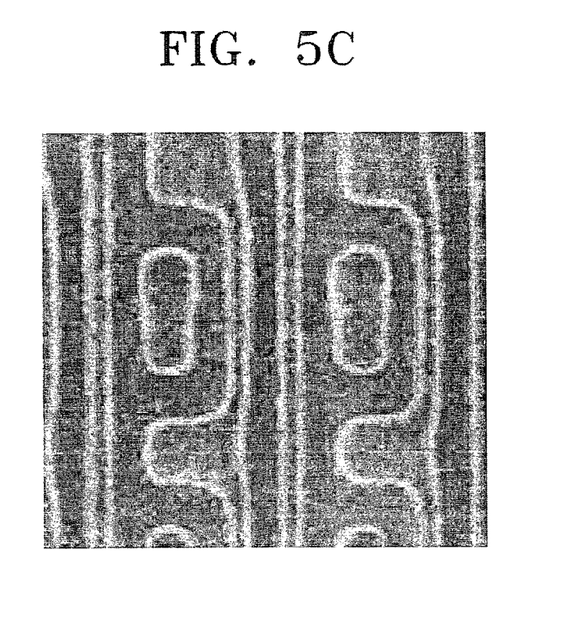
FIG. 5C is a picture illustrating the target layout circuit patterns having no defect after OPC is performed as illustrated in FIG. 5B.

FIGS. 5A and 5B illustrate a target layout circuit pattern and a circuit pattern of a mask according to some embodiments of the present invention. Referring to FIG. 5A, in the circuit pattern of a mask, distances do1 and do3 between adjacent circuit patterns and a critical dimension do2 of a circuit pattern are 0.117/0.120/0.111, 0.115/0.110/0.108 and 0.097/0.105/0.103, respectively. Referring to FIG. 5B, in the target layout circuit pattern, pitches dr1 and dr3 between adjacent circuit patterns and a critical dimension dr2 of a circuit pattern are 0.120/0.121/0.115, 0.116/0.111/0.107 and 0.093/0.099/0.098, respectively. Here, it is noted that the pitch of the target layout circuit pattern is released than the pitch between the circuit patterns on the mask. Therefore, a weak portion of a bridge is improved by forming the target layout circuit pattern after forming the LFL circuit pattern using an optical model. As a result, no bridge occurs as shown in FIG. 5C.

Figure 6:
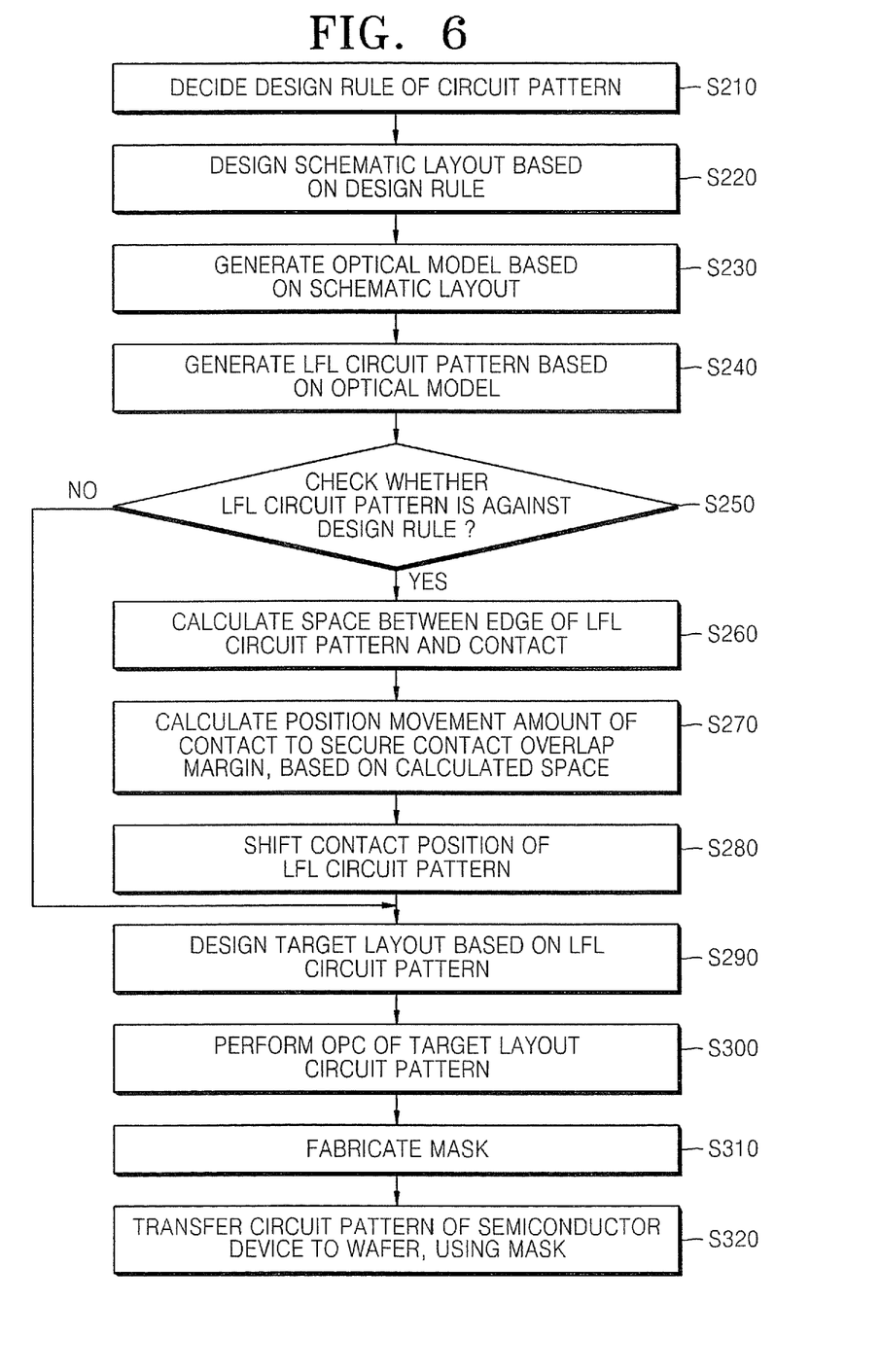
FIG. 6 is a flow chart illustrating a method of fabricating a semiconductor device using OPC, according to further embodiments of the present invention.
Figure 7A:
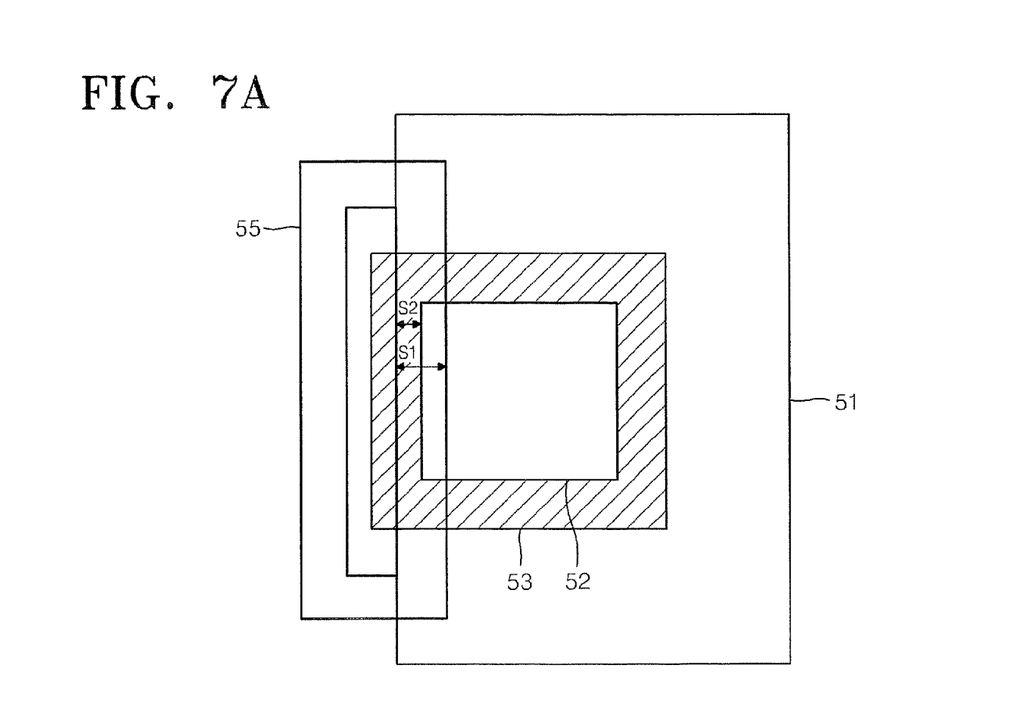
FIGS. 7A and 7B are plan views illustrating an LFL circuit pattern prior to position correction and after position correction, respectively, according to some embodiments of the present invention.
Figure 7B:
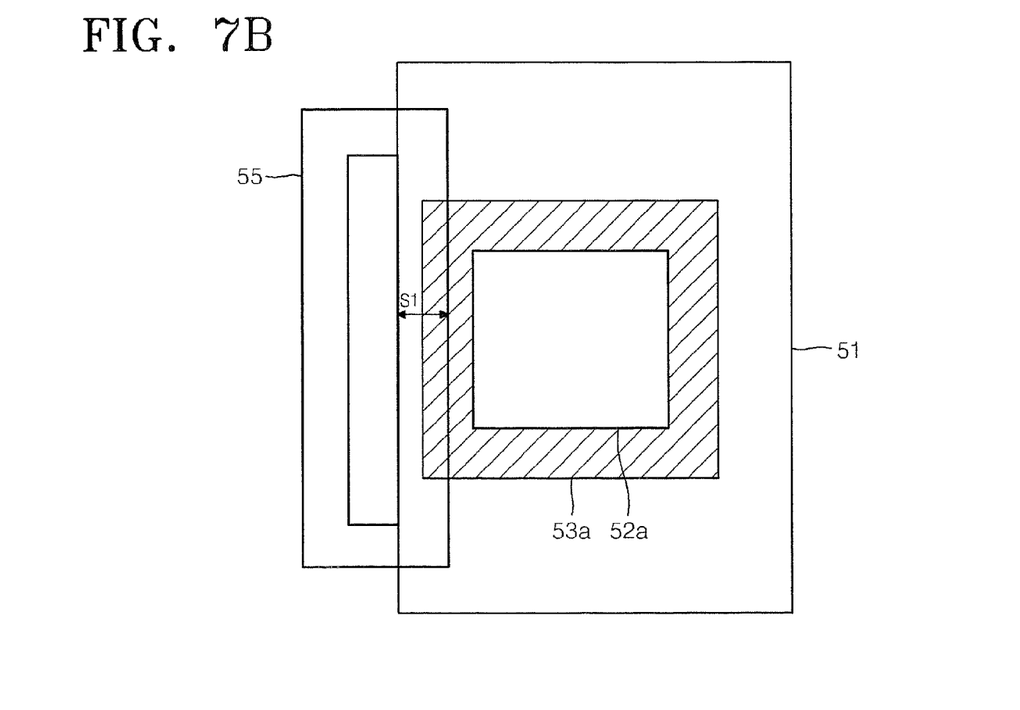

FIG. 6 is a flow chart illustrating operations for forming a circuit pattern of a semiconductor device including a contact, by using the method of fabricating a mask, according to further embodiments of the present invention. FIGS. 7A and 7B are plan views illustrating operations for forming a circuit pattern of a semiconductor device including a contact according to some embodiments according to the present invention.

Referring to FIGS. 6, 7A and 7B, in step S210 a design rule of a circuit pattern of a semiconductor device is decided, and in step S220 a schematic layout of the circuit pattern is generated based on the design rule. In step S230, an optical model is generated based on the schematic layout, and in step S240 an LFL circuit pattern 51 is generated based on the optical model. The LFL circuit pattern 51 may include a conductive pattern, for example, a bit line pattern of a DRAM. The LFL circuit pattern 51 may also include a contact 52.

Subsequently, in step S250 it is checked whether the position of the contact 52 arranged in the LFL circuit pattern 51 is against the design rule. When the contact 52 is positioned within a contact overlap margin violation region 55, it is considered as being against the design rule. That is, to secure a sufficient overlap margin, the contact 52 may be spaced apart from an edge of the LFL circuit pattern 51 by a first space S1. Actually, because the contact 52 is arranged to be spaced apart from the edge of the LFL circuit pattern 51 by a second space S2 being smaller than the first space S1, the position of the contact 52 is against the design rule. That is, the contact 52 needs to secure a contact overlap margin region 53 (the portion indicated by deviant crease lines) but it cannot secure a sufficient contact overlap margin because this is against the design rule.

Subsequently, as a result of checking whether the contact 52 is against the design rule of the contact overlap margin, when the contact 52 is against the design rule, in step S260 the second space S2 between the contact 52 and the edge of the LFL circuit pattern 51 is calculated, and in step S270 a position movement amount S3 of the contact 52 in the LFL circuit pattern 51 to secure the contact overlap margin from the first space S1 is calculated based on the calculated second space S2.

In step S280, the position of the LFL circuit pattern 51 is shifted, based on the calculated position movement amount S3. Because a shifted contact 52a maintains the space from the edge of the LFL circuit pattern 51 by the first space S1, it can secure a sufficient contact overlap margin region 53a.

In step S290, a target layout of the circuit pattern is designed, based on the LFL circuit pattern 51 in which the contact location is corrected. In step S300, OPC is performed with respect to the target layout circuit pattern. In step S310, a mask is fabricated based on an OPC circuit pattern and, in step 320, the circuit pattern of the semiconductor device is transferred to the wafer, using the fabricated mask. On the other hand, when the contact is not against the design rule of the contact overlap margin as the result of check in the step S250, going to the step S290, the target layout is designed.

In addition to the check on whether the contact is against the design rule, it may be checked whether a conductive pattern arranged in another layer, such as a gate polysilicon or the like, is against the design rule. Accordingly, because the mask is fabricated by designing a full chip layout after generating the LFL circuit pattern based on the optical model and shifting the contact of the LFL circuit pattern so as to secure the sufficient overlay margin, a desired circuit pattern without a defect may be transferred to the wafer.

In operations for fabricating a mask according to some embodiments of the present invention, an optical model of a circuit pattern of a mask is generated, an LFL circuit pattern is formed based on the optical model, and then a layout of the circuit pattern of the mask is fixed based on the LFL circuit pattern, thereby fabricating the mask. Because the layout of the LFL circuit pattern is fixed before OPC is performed, defects may not occur in layout. Because the mask is fabricated after the OPC is performed with respect to the fixed layout of the circuit pattern, a desired circuit pattern may be transferred to a wafer. Furthermore, because the circuit pattern of the mask is laid out by predicting a portion where a process window of a semiconductor device is weak, a yield of the semiconductor device may be improved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method comprising:
    identifying design rules for circuit patterns of a semiconductor device;
    generating schematic layouts of the circuit patterns of a single mask according to the design rules;
    generating lithography friendly layout (LFL) circuit patterns from the schematic layouts based on a prediction of potential spacing defects within the mask arising from optical proximity effect correction (OPC);
    generating target layout circuit patterns from the LFL circuit patterns;
    performing the OPC on the target layout circuit patterns to generate OPC circuit patterns; and
    fabricating the mask from the OPC circuit patterns.

2. The method of claim 1, wherein generating the LFL circuit patterns from the schematic layouts comprises:
    generating optical models of the schematic layouts; and
    generating the LFL circuit patterns based on the optical model.

3. The method of claim 2, wherein the optical models comprise optical intensity profiles with different Gaussian distributions.

4. The method of claim 2, wherein generating the LFL circuit patterns from the schematic layouts comprises consideration of spacing of the circuit patterns, contacts arranged in the circuit patterns, dummy patterns adjacent to the circuit patterns, and/or whether other circuit patterns are arranged in another layer than that of the circuit patterns.

5. The method of claim 1, wherein the semiconductor device is a DRAM, and wherein generating the schematic layouts of the circuit patterns according to the design rules comprises generating layouts of circuit patterns of a memory cell block and a core block.

6. The method of claim 1, wherein the semiconductor device is a DRAM, and wherein generating the schematic layouts of the circuit patterns according to the design rules comprises generating layouts of the circuit patterns of a memory cell, a core block and a peripheral circuit block.

7. A method of fabricating a semiconductor device, comprising:
    identifying a design rule for a circuit pattern of a single mask, the circuit pattern including a contact;
    generating a schematic layout of the circuit pattern based on the design rule;
    generating a lithography friendly layout (LFL) circuit pattern from the schematic layout of the circuit pattern based on a prediction of a potential spacing defect within the mask arising from optical proximity effect correction (OPC);
    determining whether a position for the contact in the LFL circuit pattern violates the design rule;
    modifying the position for the contact in the LFL circuit pattern to generate a modified LFL circuit if the position for the contact in the LFL circuit pattern violates the design rule;
    generating a target layout from the modified LFL circuit pattern;
    performing the optical proximity effect correction (OPC) on the target layout circuit pattern to generate an OPC circuit pattern;
    fabricating the mask from the OPC circuit pattern; and
    generating a circuit pattern on a wafer using the mask.

8. The method of claim 7, wherein determining whether the position for the contact in the LFL circuit pattern violates the design rule comprises comparing a first space for securing an overlap margin of the contact with a second space from an edge of the LFL circuit pattern to the contact.

9. The method of claim 7, wherein modifying the position for the contact in the LFL circuit pattern to generate the modified LFL circuit if the position for the contact in the LFL circuit pattern violates the design rule comprises:
    calculating a second space from the edge of the LFL circuit pattern to the contact;
    calculating a distance to move the contact from the second space that satisfies the overlap margin; and
    shifting the position of the contact the determined distance.

10. The method of claim 7, wherein generating the LFL circuit pattern from the schematic layout of the circuit pattern comprises:
    generating an optical model of the schematic layout; and
    generating the LFL circuit pattern from the optical model.

11. The method of claim 10, wherein generating the LFL circuit pattern from the schematic layout of the circuit pattern comprises considering a spacing of the circuit pattern, a presence of a contact in the circuit pattern, a dummy pattern adjacent the circuit pattern and/or another circuit pattern in another layer than that of the circuit pattern.

12. The method of claim 7, wherein the semiconductor device is a DRAM and wherein generating the schematic layout of the circuit pattern based on the design rule comprises generating layouts of circuit patterns of a memory cell block and a core block.

13. The method of claim 7, wherein the semiconductor device is a DRAM and wherein generating the schematic layout of the circuit pattern based on the design rule comprises generating layouts of the circuit patterns of a memory cell block, a core block and a peripheral circuit block.

\* \* \* \* \*